United States Patent
Zhao

(10) Patent No.: US 7,280,929 B1
(45) Date of Patent: Oct. 9, 2007

(54) METHOD AND APPARATUS FOR PULSE I-V SEMICONDUCTOR MEASUREMENTS

(75) Inventor: Yuegang Zhao, Solon, OH (US)

(73) Assignee: Keithley Instruments, Inc., Cleveland, OH (US)

(*) Notice: Subject to any disclaimer, the term of this patent is extended or adjusted under 35 U.S.C. 154(b) by 8 days.

(21) Appl. No.: 10/952,647

(22) Filed: Sep. 29, 2004

(51) Int. Cl.
*G01R 25/00* (2006.01)

(52) U.S. Cl. .............................. 702/65; 702/66; 702/57

(58) Field of Classification Search .................. 702/65, 702/64, 66, 57
See application file for complete search history.

(56) References Cited

U.S. PATENT DOCUMENTS 5,652,712 A * 7/1997 Szczebak et al. ............. 702/85

OTHER PUBLICATIONS

Jenkins, Keith A., et al., "Characteristics of SOI FET's Under Pulsed Conditions", IEEE Transactions on Electron Devices, vol. 44, No. 11, Nov. 1997, pp. 1923-1930.

* cited by examiner

*Primary Examiner*—John Barlow
*Assistant Examiner*—Stephen J. Cherry
(74) *Attorney, Agent, or Firm*—Pearne & Gordon LLP

(57) ABSTRACT

A method for measuring a value of an electrical characteristic of a device under test in a circuit having a load impedance includes applying a voltage to said circuit, the voltage having a selected amplitude; measuring a current in the circuit in response to the voltage; calculating an error value using the impedance, amplitude and current; adjusting the amplitude using the error value; and repeating the preceding steps until the error value reaches a desired value. This results in the selected amplitude changing from an initial value to a final value and the current changing to a final value. The initial value of the selected amplitude and the final value of the current are used to determine the electrical characteristic value.

8 Claims, 2 Drawing Sheets

METHOD AND APPARATUS FOR PULSE I-V SEMICONDUCTOR MEASUREMENTS

BACKGROUND OF THE INVENTION

The present invention relates to the measurement of I-V characteristics for semiconductor devices and, in particular, to the use of pulses in such measurements.

It is well known to characterize semiconductor devices according to their I-V curves and similar measurements. Historically, such measurements are made with DC signals applied and measured. However, these DC measurements are not always suitable. For example, in many cases, these DC measurements result in significant heating of the devices resulting in a degraded measurement.

The use of pulsed measurements has been proposed to avoid these issues, but has not been satisfactorily implemented.

SUMMARY OF THE INVENTION

A method for measuring a value of an electrical characteristic of a device under test (DUT) in a circuit having a load impedance includes applying a voltage to said circuit, the voltage having a selected amplitude; measuring a current in the circuit in response to the voltage; calculating an error value using the impedance, amplitude and current; adjusting the amplitude using the error value; and repeating the preceding steps until the error value reaches a desired value. This results in the selected amplitude changing from an initial value to a final value and the current changing to a final value. The initial value of the selected amplitude and the final value of the current are used to determine the electrical characteristic value.

DESCRIPTION OF THE PREFERRED EMBODIMENTS

Figure 1:
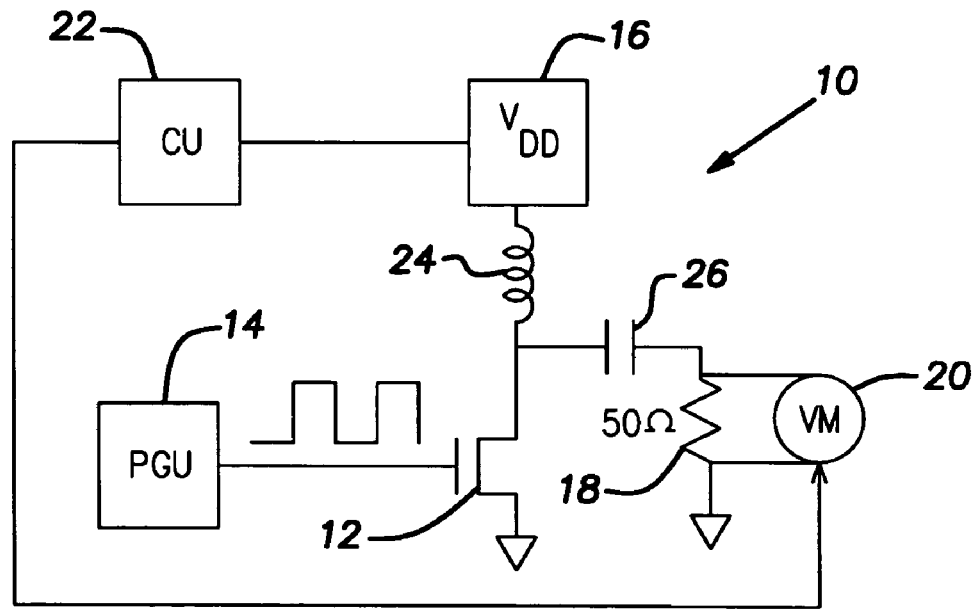
FIG. 1 is a schematic diagram of an exemplary apparatus according to the invention.

Referring to FIG. 1, an apparatus 10 for measuring an electrical characteristic of a DUT 12 includes a pulse generator 14, a voltage source 16, load impedance 18, a voltmeter 20 and a control unit 22.

The DUT 12 may be, for example, a FET device. The pulse generator 14 provides voltage pulses of a desired amplitude, pulse width and repetition rate. The voltage source 16 provides a voltage output $V_{DD}$ at a selected amplitude. The voltmeter 20 measures the voltage drop across the impedance 18 (e.g., 50 ohms) and thus provides a measure of the current through the DUT 12.

The control unit 22 controls the operation of the pulse generator 14, the voltage source 16 and the voltmeter 20. The unit 22 may be implemented in many ways. It may be, for example, a programmed general purpose computer, an application specific controller, or a programmable digital oscilloscope.

By way of example for an FET DUT, an I-V curve for the DUT 12 may be generated by applying a selected initial voltage $V_{D0}$ to the circuit along with a desired voltage from the pulse generator 14. The inductor 24 and the capacitor 26 act as a bias tee, applying the voltage to the DUT 12 and allowing ac signals to pass through the impedance 18. The current through the impedance 18 results in a voltage measured by the voltmeter 20 as the drain current $I_D$ through the DUT 12. The voltage across the impedance 18 may be represented, for example, as $I_D*50$ ohms.

Figure 2:
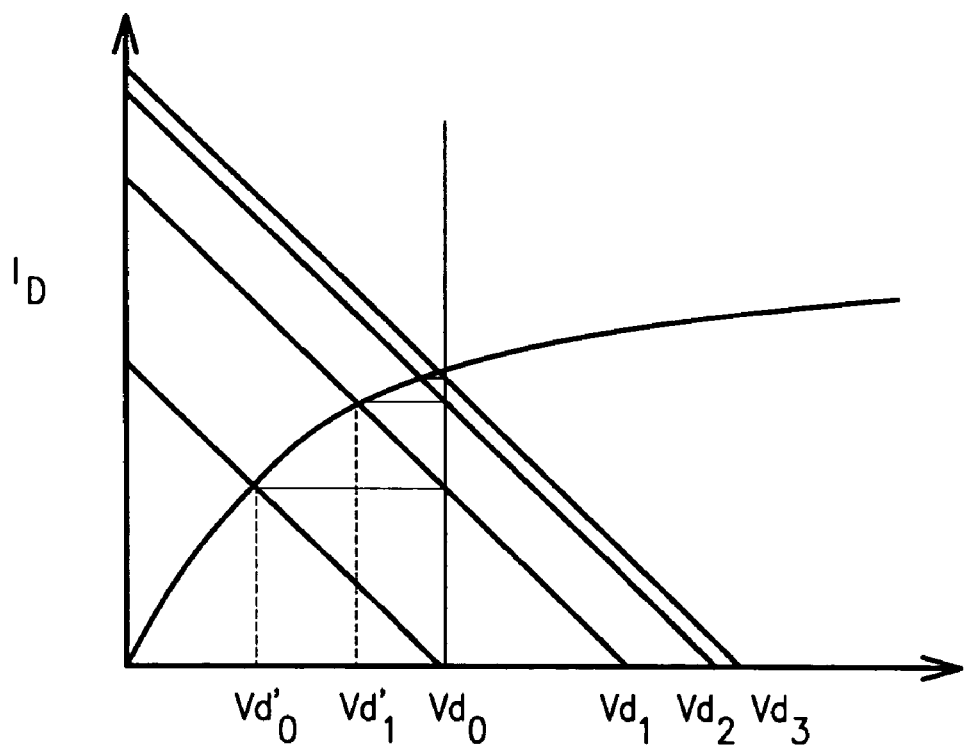
FIG. 2 is a graph illustrating an aspect of the method of the invention.

Referring to FIG. 2, a 50 ohm load line through the $V_{D0}$ value on the axis is shown. The selected voltage is then changed to $V_{D1}=V_{D0}+(I_{D0}*50$ ohms) and the process repeated. For example, $V_{D2}=V_{D1}+(I_{D1}*50$ ohms) and $V_{D3}=V_{D2}+(I_{D2}*50$ ohms).

It is important to notice that the measured value of the drain voltage $V_D$ converges toward $V_{D0}$. The value $V_{D0}-(V_{Dn}-(I_{Dn}*50$ ohms) can advantageously be used as an error estimate in the value of $V_D$. The process can be repeated until a desired value of the error value is reached or bettered. The final I-V pair, $I_{Dn}$ and $V_{D0}$, then represent a point on the I-V curve for the desired voltage from the pulse generator 14.

Typically of course, more than one point on an I-V curve is desired. Any additional value of $V_{D0}$ may be chosen and the process started again, but it is advantageous to choose the final value $V_{Dn}$ of the selected amplitude of the previous point as the initial selected amplitude. This produces convergence with 2 to 3 times less iterations.

It should be noted that it may be advantageous to sometimes perform the disclosed method where instead currents are forced and voltages are measure.

The above example applies the method of the invention to measuring $I_D$-$V_{DS}$ curves. It is also useful for other similar I-V curve applications. In particular, it is useful in $V_{GS}$-$I_D$ measurements.

In $V_{GS}$-$I_D$ measurements where a gate voltage pulse is applied, the drain current will change dramatically and, as a result, so will the voltage drop on the drain terminal because of the load line effect seen above. In the traditional approach to these measurements, this creates demands that cannot be met by the drain voltage bias. It cannot be held sufficiently constant.

Using the correction technique of this invention, the drain voltage can be held within 1 mV of the desired value.

While particularly useful in measurements using pulse techniques, the present invention is also useful in conventional dc measurements of device characteristics where a load line approach is applicable.

Figure 3:
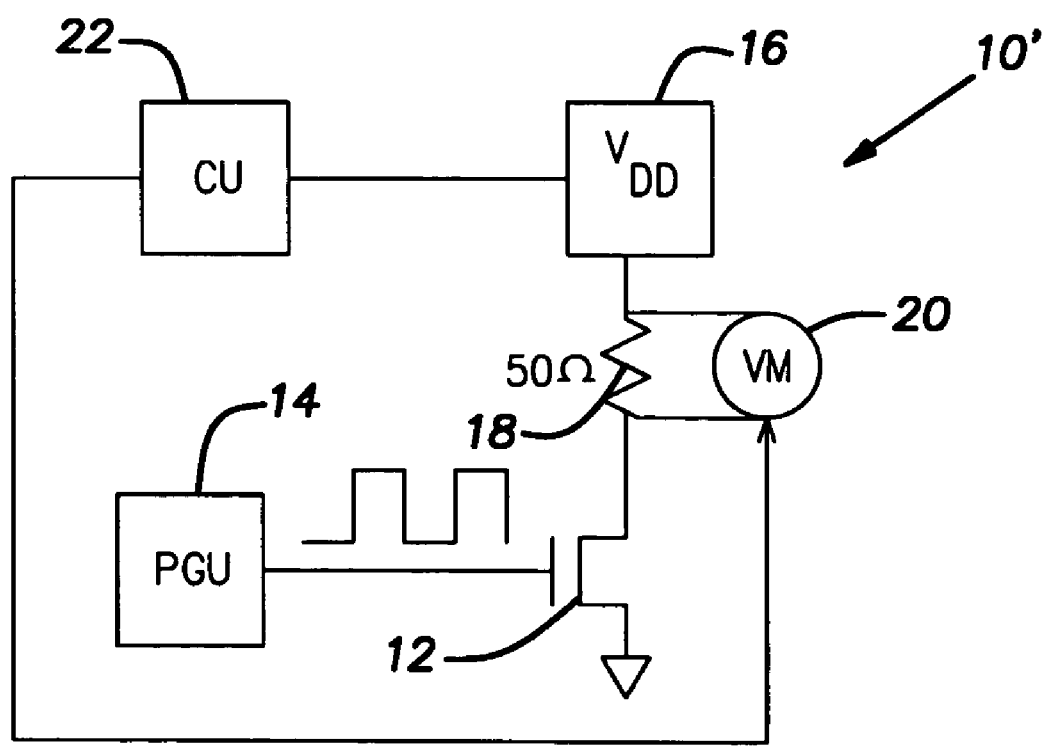
FIG. 3 is a graph illustrating another aspect of the method of the invention.

Referring to FIG. 3, an apparatus 10' is illustrated that is similar to the apparatus 10, except that the bias tee (the inductor 24 and the capacitor 26) is omitted. This configuration is useful for dc-type measurements.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring a value of an electrical characteristic of a DUT in a circuit having a load impedance, said method comprising:

applying a voltage to said circuit, said voltage having a selected amplitude;

measuring a current in said circuit in response to said voltage;

calculating an error value using said impedance, said amplitude and said current;

adjusting said amplitude using said error value;

repeating the preceding steps until said error value reaches a desired value resulting in said selected amplitude changing from an initial value to a final value and said current changing to a final value, wherein said initial value of said selected amplitude and said final value of said current are used to determine said electrical characteristic value;

measuring another value of said electrical characteristic wherein the initial amplitude is the final value of a previous amplitude; and outputting, displaying, storing, or otherwise conveying the values of said electrical characteristic.

2. A method for measuring a value of an electrical characteristic of a DUT in a circuit having a load impedance, said method comprising:

applying a current to said circuit, said current having a selected amplitude;

measuring a voltage in said circuit in response to said current;

calculating an error value using said impedance, said amplitude and said voltage;

adjusting said amplitude using said error value;

repeating the preceding steps until said error value reaches a desired value resulting in said selected amplitude changing from an initial value to a final value and said voltage changing to a final value, wherein said initial value of said selected amplitude and said final value of said voltage are used to determine said electrical characteristic value;

measuring another value of said electrical characteristic wherein the initial amplitude is the final value of a previous amplitude; and outputting, displaying, storing, or otherwise conveying the values of said electrical characteristic.

3. A method for measuring a value of an I-V characteristic of a three-terminal element in a circuit having a load impedance, said method comprising:

applying a voltage pulse to at least one of said terminals, said pulse having a desired amplitude;

applying a voltage to another of said terminals, said voltage having a selected amplitude;

measuring a current in said circuit in response to said pulse;

calculating an error value using said impedance, said amplitude and said current;

adjusting said amplitude using said error value;

repeating the preceding steps until said error value reaches a desired value resulting in said selected amplitude changing from an initial value to a final value and said current changing to a final value, wherein said initial value of said selected amplitude and said final value of said current are used to determine said I-V characteristic value for said desired voltage; and outputting, displaying, storing, or otherwise conveying said I-V characteristic value.

4. A method according to claim 3, further comprising measuring another value of said I-V characteristic wherein the initial amplitude is the final value of a previous amplitude.

5. An apparatus for measuring a value of an electrical characteristic of a DUT in a circuit having a load impedance, said apparatus comprising:

a voltage source connectable to said circuit;
a measuring device connectable to said circuit; and
a processor for calculating said electrical characteristic, wherein a voltage is applied to said circuit, said voltage having a selected amplitude; a current is measured in said circuit in response to said voltage; an error value is calculated using said impedance, said amplitude and said current; said amplitude is adjusted using said error value; the preceding steps are repeated until said error value reaches a desired value resulting in said selected amplitude changing from an initial value to a final value and said current changing to a final value, wherein said initial value of said selected amplitude and said final value of said current are used to determine said electrical characteristic value; and another value of said electrical characteristic is measured wherein the initial amplitude is the final value of a previous amplitude, whereby the values of said electrical characteristic are output, displayed, stored or otherwise conveyed.

6. An apparatus for measuring a value of an electrical characteristic of a DUT in a circuit having a load impedance, said apparatus comprising:

a current source connectable to said circuit;
a measuring device connectable to said circuit; and
a processor for calculating said electrical characteristic, wherein a current is applied to said circuit, said current having a selected amplitude; a voltage is measured in said circuit in response to said current; an error value is calculated using said impedance, said amplitude and said voltage; said amplitude is adjusted using said error value; the preceding steps are repeated until said error value reaches a desired value resulting in said selected amplitude changing from an initial value to a final value and said voltage changing to a final value, wherein said initial value of said selected amplitude and said final value of said current are used to determine said electrical characteristic value; and another value of said electrical characteristic is measured wherein the initial amplitude is the final value of a previous amplitude, whereby the values of said electrical characteristic are output, displayed, stored or otherwise conveyed.

7. An apparatus for measuring a value of an I-V characteristic of a three-terminal device in a circuit having a load impedance, said apparatus comprising:

a voltage pulse source connectable to said circuit;
a voltage source connectable to said circuit;
a measuring device connectable to said circuit; and
a processor for calculating said electrical characteristic, wherein a voltage pulse is applied to at least one of said terminals, said pulse having a desired amplitude; a voltage is applied to another terminal, said voltage having a selected amplitude; a current is measured in said circuit in response to said pulse; an error value is calculated using said impedance, said amplitude and said current; said amplitude is adjusted using said error value; and the preceding steps are repeated until said error value reaches a desired value resulting in said selected amplitude changing from an initial value to a final value and said current changing to a final value, wherein said initial value of said selected amplitude and said final value of said current are used to determine said I-V characteristic value for said desired voltage, whereby said I-V characteristic value is output, displayed, stored or otherwise conveyed.

8. An apparatus according to claim 7, wherein another value of said I-V characteristic is measured wherein the initial amplitude is the final value of a previous amplitude.

* * * * *